US006944193B2

(12) United States Patent
Miyaki

(10) Patent No.: US 6,944,193 B2
(45) Date of Patent: Sep. 13, 2005

(54) WAVELENGTH TUNING MECHANISM

(75) Inventor: Shosuke Miyaki, Sizuoka (JP)

(73) Assignee: Yakagawa Electric Corporation, Tokyo (JP)

( * ) Notice: Subject to any disclaimer, the term of this patent is extended or adjusted under 35 U.S.C. 154(b) by 196 days.

(21) Appl. No.: 10/395,526

(22) Filed: Mar. 24, 2003

(65) Prior Publication Data

US 2003/0184890 A1 Oct. 2, 2003

(30) Foreign Application Priority Data

Mar. 28, 2002 (JP) .................................... P. 2002-090355

(51) Int. Cl.[7] .................................................. H01S 3/10
(52) U.S. Cl. ............................. 372/20; 372/92; 372/93
(58) Field of Search ............................... 372/20, 92, 93

(56) References Cited

U.S. PATENT DOCUMENTS 5,594,744 A * 1/1997 Lefevre et al. ............... 372/20
6,016,323 A * 1/2000 Kafka et al. .................. 372/20
6,249,537 B1 * 6/2001 Merriam et al. ............ 372/102
6,282,213 B1 * 8/2001 Gutin et al. .................. 372/20
2001/0026563 A1 * 10/2001 Yagi ............................ 372/15
2001/0026568 A1 * 10/2001 Asami ......................... 372/43
2002/0015427 A1 * 2/2002 Pilgrim et al. ................ 372/20

* cited by examiner

*Primary Examiner*—MinSun Harvey
*Assistant Examiner*—James Menefee
(74) *Attorney, Agent, or Firm*—Sughrue Mion, PLLC

(57) ABSTRACT

A Littman configuration type wavelength tuning mechanism comprising an LD block (1), a grating (3) and a wavelength adjusting mirror (4). In the wavelength tuning mechanism, turning means realizing a Littman configuration of said grating with regard to said wavelength adjusting mirror is realized by an armless structure to be turned about the virtual pivot (2-2) of said wavelength adjusting mirror.

7 Claims, 2 Drawing Sheets

WAVELENGTH TUNING MECHANISM

BACKGROUND OF THE INVENTION

1. Field of the Invention

The present invention relates to a wavelength tuning mechanism having a Littman configuration for making a wavelength variable without causing any mode hop.

2. Background Art

The Littman configuration is known as a wavelength tuning mechanism for making a wavelength variable without causing any mode hop (as referred to Vol. 6, No. 3 of OPTICS LETTER in March, 1981).

An example of the wavelength tuning mechanism according to this Littman configuration is shown in FIG. 1.

FIG. 1A is a side elevation of a wavelength tuning mechanism having the Littman configuration, and FIG. 1B is a top plan view of the wavelength tuning mechanism.

In FIG. 1A, the wavelength tuning mechanism is constructed to include an LD block (1), a bearing case (2), a grating (plane diffraction grating) (3), a wavelength adjusting mirror (4) and a mirror arm (5).

The LD block (1) includes an isolator (1-1), a first lens (1-2), an LD (Laser Diode) (1-3) and a second lens (1-4), and the bearing case (2) includes a bearing (2-1) and a mirror pivot (2-2).

Here will be described the positional relations among the components of FIG. 1A.

In FIG. 1A, the LD block (1), the wavelength adjusting mirror (4) and the grating (3) are arranged on a straight line in a top plan view, and the wavelength adjusting mirror (4) carried on the mirror arm (5) is turned about the mirror pivot (2-2) of the bearing case (2) by a drive unit such as a not-shown pulse motor.

As apparent from the positional relations of FIG. 1A, the LD block (1) and the bearing case (2) are in positions where they interfere with each other (In FIG. 1A, the LD block (1) and the bearing case (2) are shown in a vertically overlapping state (in which the bearing case (2) is arranged on the lower (or upper) side of the LD block (1)). It is a problem to modify these two so that they do not interfere.

If the LD block (1) and the bearing case (2) are arranged on a common surface so as to avoid the aforementioned positional interference, moreover, there are large distances between the individual parts. Therefore, the optical path is elongated to make the mechanism structurally unstable, causing a problem that a large-sized device has lower commercial value and is uneconomical.

SUMMARY OF THE INVENTION

A problem (or object) of the invention is to reduce the size of the wavelength tuning mechanism making the wavelength variable without causing any mode hop.

In order to solve the aforementioned problem, there is provided a Littman configuration type wavelength tuning mechanism comprising a laser diode (LD) block, a grating and a wavelength adjusting mirror, wherein turning means realizing a Littman configuration of said grating with regard to said wavelength adjusting mirror is realized by an armless structure to be turned about the virtual pivot of said wavelength adjusting mirror.

In some implementations, said armless structure includes: an arcuate rail having its center of arc aligned with the fixed virtual pivot of said wavelength adjusting mirror; and a plurality of bearings.

In some implementations, said armless structure includes: an arcuate rail having its center of arc aligned with the fixed virtual pivot of said wavelength adjusting mirror; and a plurality of V-grooved bearings.

In some implementations, said armless structure holds the fixed arcuate rail of the wavelength adjusting mirror turnably with the three V-grooved bearings fixed on the baseplate.

In some implementations, said arcuate rail is fixed whereas the baseplate is made movable.

In some implementations, said armless structure includes a direct-acting bearing of an arcuate shape having its center of arc aligned with the fixed virtual pivot of said wavelength adjusting mirror.

In some implementations, said LD block includes an isolator, a lens and a laser diode.

DESCRIPTION OF THE PREFERRED EMBODIMENT

A wavelength tuning mechanism having the Littman configuration according to one embodiment of the invention will be described with reference to FIG. 2.

Figure 1A:
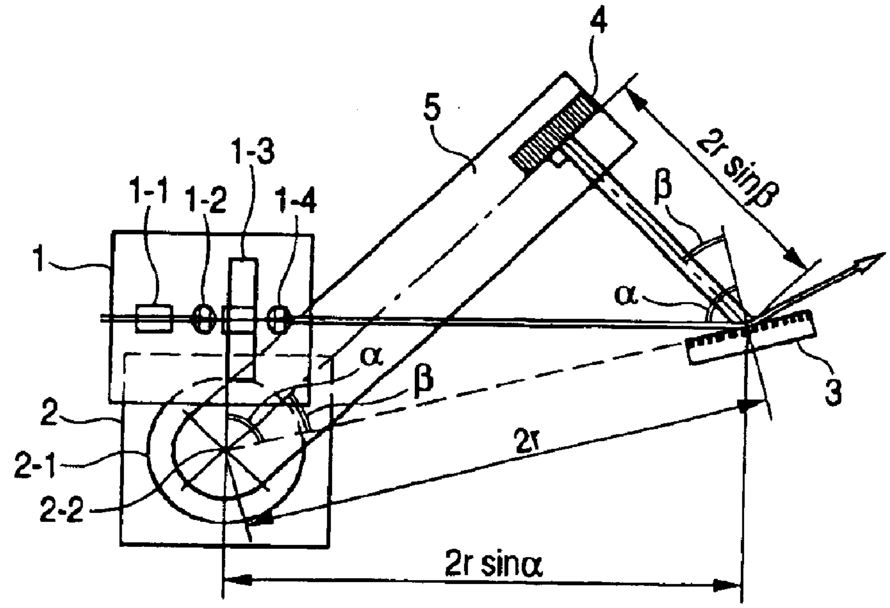
FIG. 1 is a diagram showing a construction of the Littman configuration wavelength tuning mechanism of the related art.
Figure 1B:
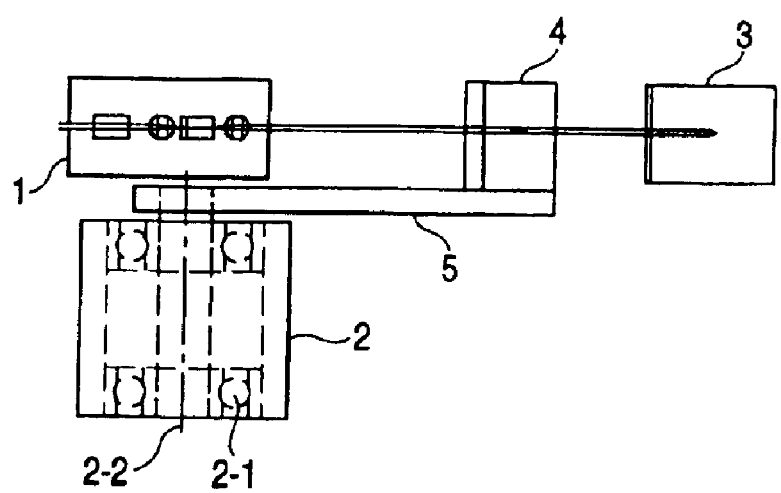
Figure 2A:
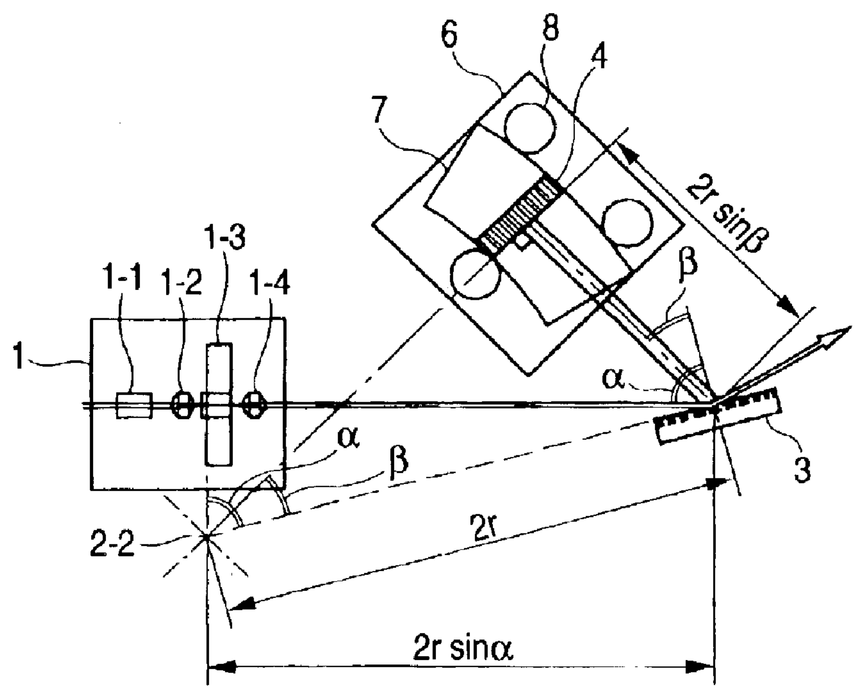
FIG. 2 is a diagram showing a construction of a Littman configuration wavelength tuning mechanism of the invention.
Figure 2B:
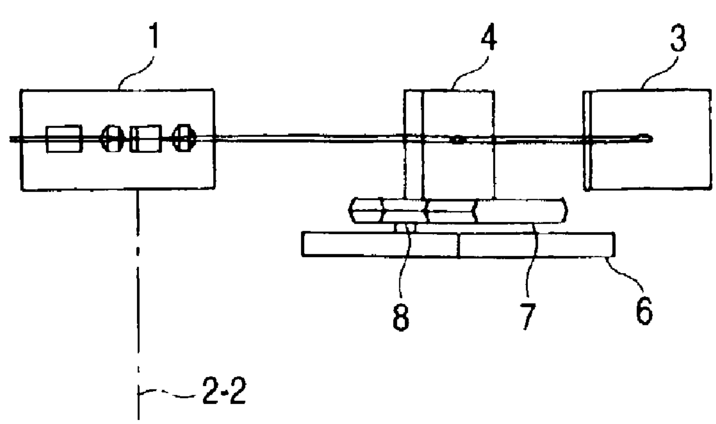

FIG. 2A is a side elevation of the Littman configuration wavelength tuning mechanism, and FIG. 2B is a top plan view of the wavelength tuning mechanism.

In FIG. 2A, the wavelength tuning mechanism is constructed to include an LD block (1), a mirror pivot (2-2), a grating (or plane diffraction grating) (3), a wavelength adjusting mirror (4), a baseplate (6), an arcuate rail (7) and V-grooved bearings (8).

The LD block (1) includes an isolator (1-1), a first lens (1-2), an LD (Laser Diode) (1-3) and a second lens (1-4), and the three V-grooved bearings (8) are mounted on the baseplate (6).

Moreover, the arcuate rail (7) carrying the wavelength adjusting mirror (4) is turnably held by the three V-grooved bearings (8) so as to turn on the mirror pivot (2-2).

Here in FIG. 2, three V-grooved bearings (8) for holding the arcuate rail (7) are provided, one inside and two outside of the arcuate rail (7). However, it is not always necessary that three V-grooved bearings are constructed, but it is needless to say that three or more V-grooved bearings can be used.

In FIG. 2, moreover, there is shown an example, in which the V-grooved bearings (8) are employed to hold the arcuate rail (7). However, the V-grooved bearings are not essential, and the bearings used may be of another type.

In the wavelength tuning mechanism of FIG. 2, moreover, the three V-grooved bearings are employed to hold the arcuate rail but may be replaced by a commercially available direct-acting bearing having an arcuate shape.

In the wavelength tuning mechanism of FIG. 2, moreover, the wavelength adjusting mirror (4) is mounted on the arcuate rail (7). However, the baseplate (6) may be moved and the arcuate rail (7) may be fixed.

The wavelength tuning mechanism of FIG. 2 can dispense with the mirror arm, which is indispensable for the conventional mechanism. Therefore, the arrangement of the arcuate rail carrying the wavelength adjusting mirror can be given a high degree of freedom in relation to the LD block (1) making possible a wavelength tuning mechanism with a thinner structure, so that a more compact device can be realized.

In the wavelength tuning mechanism of FIG. 2, moreover, the arcuate rail (7) can be arranged close to the wavelength adjusting mirror (4) thereby to reduce the moment load resulting from supporting the wavelength adjusting mirror (4). As a result, the size of the V-grooved bearings (8) for supporting the arcuate rail (7) can be reduced to make possible construction of a more compact device.

According to some implementations, there is provided a Littman configuration type wavelength tuning mechanism comprising an LD block, a grating and a wavelength adjusting mirror, wherein turning means for turning the wavelength adjusting mirror to achieve a Littman configuration with the grating is realized by an armless structure to be turned about the virtual pivot of the wavelength adjusting mirror. Therefore, the mirror arm needed for turning the conventional wavelength adjusting mirror can be eliminated to reduce the limits to the arrangement of the components and make possible reduction of the size of the wavelength tuning mechanism.

In some implementations moreover, the armless structure is constructed to include: an arcuate rail having a center of arc aligned with the fixed virtual pivot of the wavelength adjusting mirror and a plurality of bearings. The arcuate rail can be arranged close to the wavelength adjusting mirror, thereby reducing the moment load created by supporting the wavelength adjusting mirror. As a result, the size of the bearings employed can be reduced and a more compact wavelength tuning mechanism can be realized.

In some implementations moreover, the armless structure is constructed to include: an arcuate rail having a center of arc aligned with the fixed virtual pivot of the wavelength adjusting mirror; and a plurality of V-grooved bearings. The arcuate rail can be arranged close to the wavelength adjusting mirror thereby to reduce the moment load created by supporting the wavelength adjusting mirror. As a result, the size of the V-grooved bearings employed can be reduced and a more compact wavelength tuning mechanism can be realized.

In some implementations moreover, the armless structure holds the fixed arcuate rail of the wavelength adjusting mirror turnably with the three V-grooved bearings fixed on the baseplate. Therefore, the arcuate rail can be held by a reduced number of V-grooved bearings.

In some implementations moreover, the arcuate rail is fixed whereas the baseplate is made movable. It is, therefore, possible to enhance the degree of freedom in arranging the components.

In some implementations moreover, the armless structure is constructed to include a direct-acting bearing of an arcuate shape having an arcuate center aligned with the fixed virtual pivot of the wavelength adjusting mirror. It is, therefore, possible to employ the commercially available direct-acting bearings of the arcuate shape.

Moreover, some implementations can employ the LD block including an isolator, a lens and a laser diode.

What is claimed is:

1. A Littman configuration type wavelength tuning mechanism, comprising a laser diode block, a grating and a wavelength adjusting mirror, wherein turning means realizing a Littman configuration of said grating with regard to said wavelength adjusting mirror is realized by an armless structure to be turned about the virtual pivot of said wavelength adjusting mirror, wherein said armless structure includes: an arcuate rail having a center of arc aligned with the fixed virtual pivot of said wavelength adjusting mirror; and a plurality of bearings.

2. A Littman configuration type wavelength tuning mechanism, comprising a laser diode block, a grating and a wavelength adjusting mirror, wherein turning means realizing a Littman configuration of said grating with regard to said wavelength adjusting mirror is realized by an armless structure to be turned about the virtual pivot of said wavelength adjusting mirror, wherein said armless structure includes: an arcuate rail having a center of arc aligned with the fixed virtual pivot of said wavelength adjusting mirror; and a plurality of V-grooved bearings.

3. A Littman configuration type wavelength tuning mechanism according to claim 2, wherein said armless structure holds the fixed arcuate rail of the wavelength adjusting mirror turnably with the three V-grooved bearings fixed on a baseplate.

4. A Littman configuration type wavelength tuning mechanism according claim 3, wherein said arcuate rail is fixed whereas the baseplate is movable.

5. A Littman configuration type wavelength tuning mechanism according to claim 4, laser diode block includes an isolator, a lens and a laser diode.

6. A Littman configuration type wavelength tuning mechanism, comprising a laser diode block, a grating and a wavelength adjusting mirror, wherein turning means realizing a Littman configuration of said grating with regard to said wavelength adjusting mirror is realized by an armless structure to be turned about the virtual pivot of said wavelength adjusting mirror, wherein said armless structure includes: a direct-acting bearing of an arcuate shape having a center of are aligned with the fixed virtual pivot of said wavelength adjusting mirror.

7. A Littman configuration type wavelength tuning mechanism according to any of claims 1 to 3 or claim 6, wherein said laser diode block includes an isolator, a lens and a laser diode.

* * * * *